United States Patent
Ranta et al.

(10) Patent No.: US 8,243,423 B2
(45) Date of Patent: Aug. 14, 2012

(54) EXPANDABLE METER CENTER EMPLOYING DIGITAL ELECTRONIC METER ASSEMBLIES

(75) Inventors: Michael J. Ranta, Morton, IL (US); Eric A. Samuelson, Springfield, IL (US); James L. Gehlbach, Lincoln, IL (US); Paul D. Seff, Williamsburg, VA (US)

(73) Assignee: Eaton Corporation, Cleveland, OH (US)

( * ) Notice: Subject to any disclaimer, the term of this patent is extended or adjusted under 35 U.S.C. 154(b) by 237 days.

(21) Appl. No.: 12/590,035

(22) Filed: Oct. 30, 2009

(65) Prior Publication Data

US 2011/0102975 A1    May 5, 2011

(51) Int. Cl.
*H02B 1/00* (2006.01)

(52) U.S. Cl. .................................. 361/660; 361/663

(58) Field of Classification Search .......... 361/659–660, 361/664, 665, 666, 663
See application file for complete search history.

(56) References Cited

U.S. PATENT DOCUMENTS

| | | | | |
|---|---|---|---|---|
| 3,530,340 | A | * | 9/1970 | Meacham ..................... 361/660 |
| 4,041,358 | A | * | 8/1977 | Donahue et al. ............... 361/660 |
| 4,359,645 | A | * | 11/1982 | Schacht et al. ................ 307/113 |
| 4,575,801 | A | | 3/1986 | Hoberman et al. |
| 4,783,748 | A | | 11/1988 | Swarztrauber et al. |
| 4,804,957 | A | | 2/1989 | Selph et al. |
| 5,936,834 | A | | 8/1999 | Polston et al. |
| 6,947,854 | B2 | | 9/2005 | Swarztrauber et al. |
| 7,252,543 | B2 | | 8/2007 | Caggiano et al. |
| 7,358,441 | B1 | * | 4/2008 | Seff et al. ..................... 174/58 |
| 7,400,495 | B1 | | 7/2008 | Ranta et al. |
| 2007/0150237 | A1 | | 6/2007 | Swarztrauber et al. |
| 2007/0194949 | A1 | | 8/2007 | Swarztrauber et al. |
| 2009/0251852 | A1 | * | 10/2009 | Zhang et al. .................. 361/660 |

OTHER PUBLICATIONS

Schneider Electric, "PowerLogic® High Density Metering," Document No. 3000BR0705R2/08, Feb. 2008, 6 pages.
Eaton Marina Power & Lighting, "United Metering Services, Digital Electronic Meter, Model # UMS10025, Installation and Specifications," Feb. 2007, 18 pages.
Veris Industries, Enercept® Networked Power Meters (Modbus® RTU), 2008, 2 pages.
Veris Industries, "Enercept® H8035/H8036 Modbus Energy Meter Networked kW/kWh Transducers", Document No. Z201686-OG, 2008, 11 pages.
Eaton Cutler-Hammer, "PRC7000™ Tenant Metering," Publication No. PA01409001E/Z6777, Feb. 2008, 2 pages.
Schneider Electric, "PowerLogic® Factory Assembled Enclosures for Metering, Communications and Control", Document No. 3000CT0801, Mar. 2008, 44 pages.

* cited by examiner

*Primary Examiner* — Zachary M Pape
(74) *Attorney, Agent, or Firm* — Jaquez & Associates; Martin J. Jaquez, Esq.; Lisa M. Griffith, Esq.

(57) ABSTRACT

An improved gangable meter center for distributing electric power to and measuring electric power consumption by a plurality of individually measured units in a complex comprises: a plurality of meters for measuring the electric power consumption by the plurality of individually measured units in the complex; and a plurality of feeder buses electrically coupled between at least one utility line supplying power to the plurality of individually measured units in the complex, wherein the plurality of meters are included within the meter center without use of a meter socket. Ganged meter centers comprise at least two such gangable meter centers.

13 Claims, 9 Drawing Sheets

EXPANDABLE METER CENTER EMPLOYING DIGITAL ELECTRONIC METER ASSEMBLIES

BACKGROUND

The disclosed methods and apparatus generally relate to methods and apparatus for electrical power distribution and metering systems and, more particularly, to meter centers comprising digital electronic meter assemblies.

Conventionally, electric power consumption within residential or commercial buildings (and consumed by individual units located therein) is measured using electromechanical watt-hour meters. Although there are several different types of watt-hour meters in widespread use today, each typically essentially comprises a small electric motor and a counter. A precise fraction of the current flowing in the circuit is diverted to operate the motor. The speed at which the motor turns is proportional to the current in the circuit, and, therefore, each revolution of the motor's rotor corresponds to a given amount of current flowing through the circuit. The counter is coupled to the rotor and adds and displays the amount of power the circuit has carried based on the number of revolutions of the rotor.

Conventional watt-hour meters, typically those electromechanical watt-hour meters having spinning discs, are being replaced by utility companies with digital meters (also referred to, for example, as "digital watt-hour meters," "electronic meters," or "digital electronic meters"). Digital meters typically sample voltage and current flowing through the meter thousands of times a second. An electronic circuit uses the sampled values to calculate root mean square (RMS) voltage, RMS current, Volt-Amps (VA), power, power factor (PF), and kilowatt-hours. The simple model displays that information on a display, such as a liquid crystal display (LCD). More sophisticated models retain the information over an extended period of time and can transmit the information to field equipment or a central location.

For example, digital meters can automatically transmit the amount of electric power consumed by a user to a power provider. In this way, the meter advantageously does not need to be manually read. High-end digital meters can be equipped with a range of communication technologies, including the following: Low Power Radio (LPR), Global System for Mobile Communications (GSM), General Packet Radio Service (GPRS), Bluetooth, and Infrared Data Association (IrDA), and the conventional Recommended Standards—RS-232 and RS-485—wired link technologies. Such meters are able to store entire usage profiles with time stamps and relay them at a click of a button. Demand readings stored together with the profiles accurately indicate customer load requirements. The load profile data is processed by the utility company and renders itself adaptable to a variety of representations, graphs, reports, and the like.

Meters can also be read manually or using semi-automated technology. Often, meters designed for semi-automated reading include a serial port. The serial port communicates via an infrared light-emitting diode (LED) that is positioned through the faceplate of the meter. In some apartment buildings, a similar protocol may be used. However, a wired bus using a serial current loop is typically used to couple all the meters to a single plug. The plug is often located proximate mailboxes in the building.

Sub-metering comprises the resale of electricity or allocation of costs within a multi-unit site. Meter centers have been used to facilitate sub-metering. Meter centers including a plurality of socket-type meters are commonly used to distribute electricity to and measure electric power consumed by, for example, the various tenants of a multi-unit residential site (e.g., without limitation, an apartment building) or commercial site (e.g., without limitation, an office complex). Depending on their configuration, meter centers may also be referred to, for example, as "multiple metering stacks," "gangable (or expandable) metering stacks," and "group metering stacks."

Individual watt-hour meters typically plug into standardized sockets in North American meter centers by clamping of stabs on a meter with jaws of a corresponding socket. While this permits meters to be replaced without disturbing wires coupled to the sockets, it negatively impacts the ability to easily replace or update the types of meters that are used in existing meter centers. While digital socket-type meters have been developed for retrofitting in conventional meter centers (e.g., see U.S. Pat. No. 4,804,957, several solid-state meters sold by Itron Inc. (Liberty Lake, Wash.), and the "S-20" solid-state socket meter available from Quadlogic (Long Island City, N.Y.)), improvements in this regard are still needed. For example, clamping of meters into meter sockets typically does not provide as secure of an electrical connection as is provided by other coupling apparatus and methodology, resulting in more likely malfunction of, tampering with, or even theft of the meter.

Figure 1:
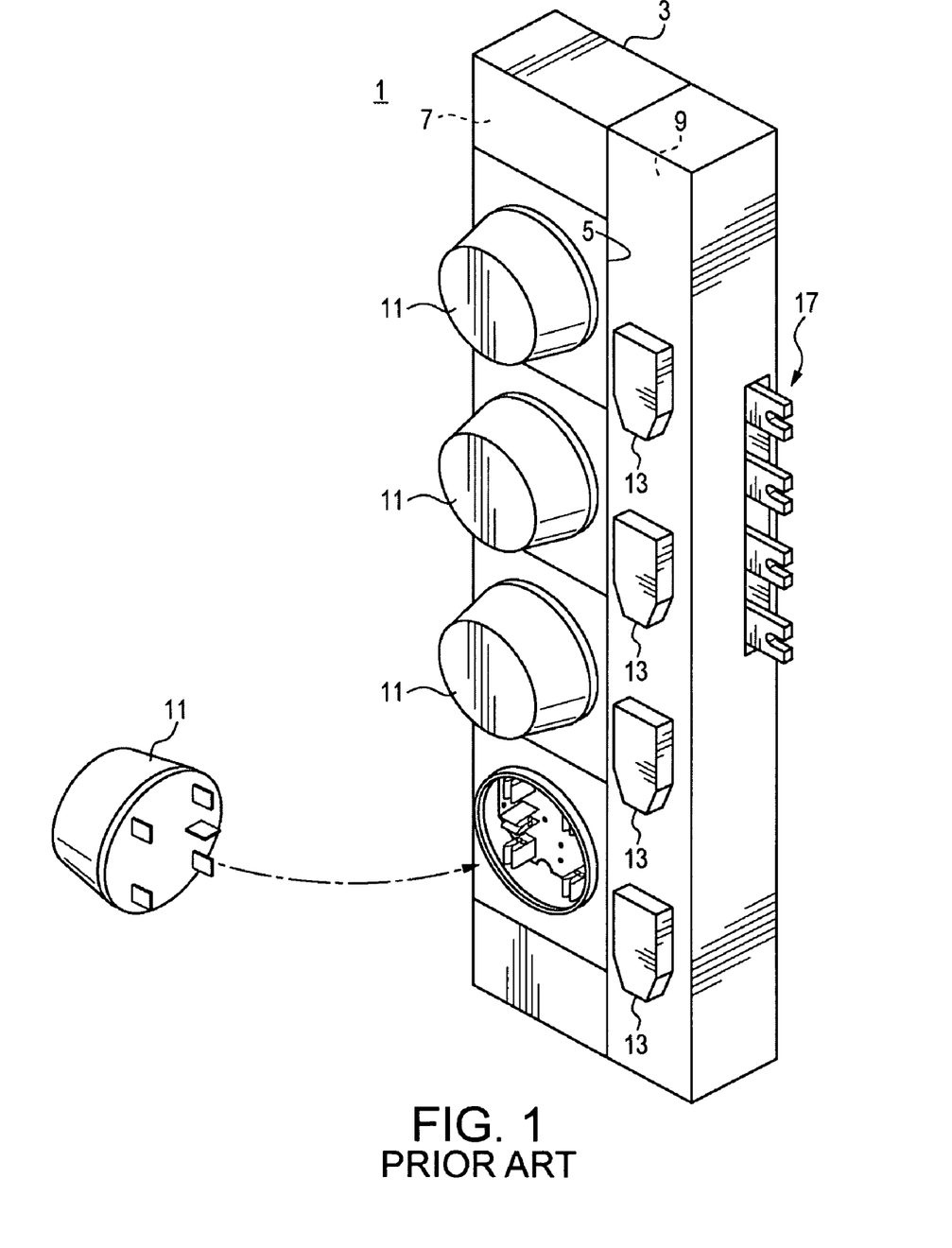
FIG. 1 is a partially exploded isometric view of a prior art meter center including a cabinet with four meters, with one of the meters shown as being "exploded" from the cabinet showing details of a meter socket assembly.
Figure 2:
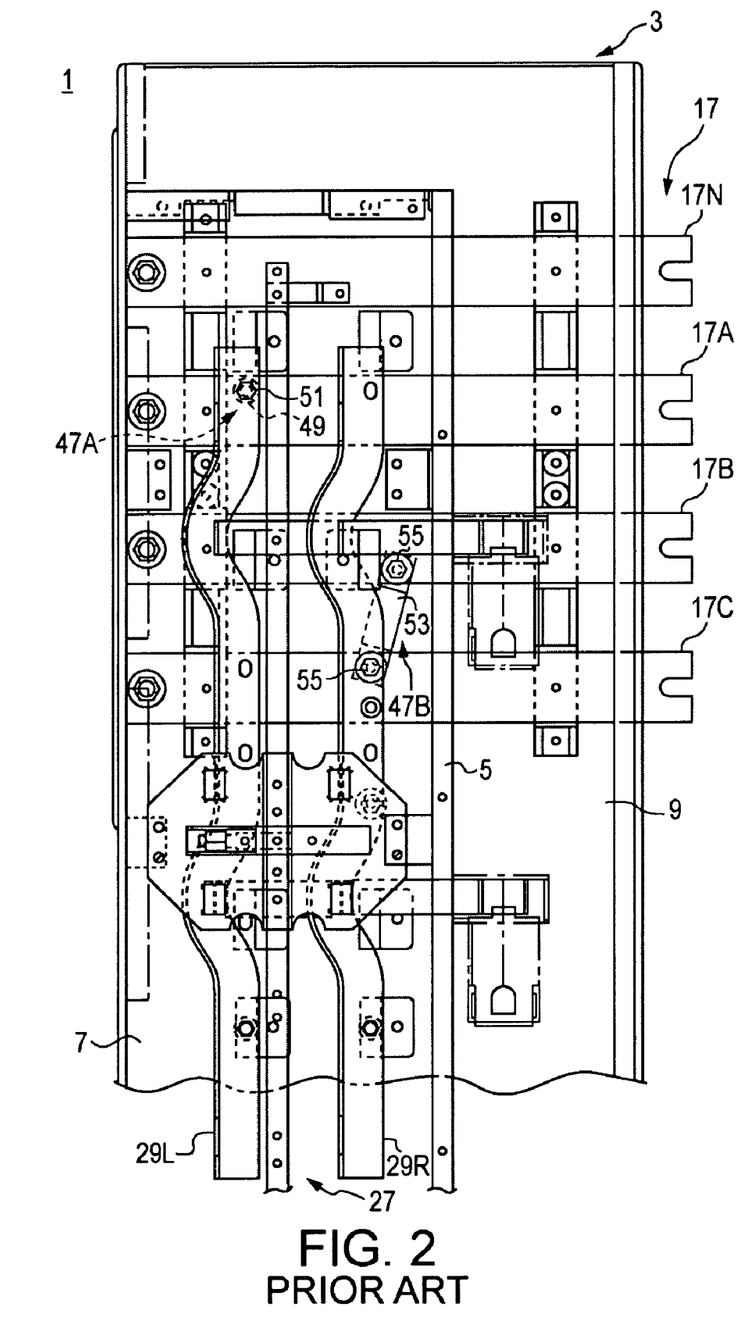
FIG. 2 is a vertical elevational view of a top portion of the meter center of FIG. 1, with the cover of the cabinet shown removed to show internal details.

FIGS. 1 and 2 illustrate a prior art meter center 1 assembly, which generally consists of a cabinet 3 having an internal longitudinal wall 5 that divides the cabinet 3 into side-by-side meter and disconnect switch compartments 7, 9. A plurality of plug-in, socket-type watt-hour meters 11 are mounted within the meter compartment 7, one meter 11 for each tenant circuit to be metered. Thus, in the example of FIG. 1, the meter center 1 accommodates four tenant circuits each served by its own meter 11. Each tenant circuit is also provided with a disconnect switch 13 such as, for example, a circuit breaker, which is mounted within the disconnect switch compartment 9. Electric power is provided to the meter center 1 by feeder buses 17 that are electrically coupled to utility lines (not shown) for power supply. Specifically, as shown in FIG. 2, three differently phased feeder buses 17A, 17B, 17C and a neutral feeder bus 17N extend horizontally through the cabinet 3 for electrical connection to the utility lines. A set of supply buses 27 extends vertically within the meter compartment 7 for electrical connection to the feeder buses 17. More specifically, the supply buses 27 generally comprise a pair of spaced apart bus bars 29R, 29L, which are each electrically coupled to one of the feeder buses 17A, 17B, 17C by a phase balancer 47A, 47B. For example, the left supply bus bar 29L in the example of FIG. 2 is electrically coupled to the phase A feeder bus 17A by phase balancer 47A, and the right supply bus bar 29R is electrically connected to the phase B feeder bus 17B by phase balancer 47B. Phase balancer 47A generally consists of a cylindrical sleeve 49 (shown in hidden line drawing) and bolt 51. Phase balancer 47B generally consists of a "Z"-shaped member 53 and bolts 55. Thus, the entire meter center 1 is configured in the same manner, in this case phase A-B, although it will be appreciated that it could also be entirely phased A-C (using feeder phase buses 17A and 17C) or B-C (using feeder buses 17B and 17C) or different meters within the same cabinet can be phased differently (e.g., on two different phase combinations, such as A-C and B-C).

Other systems and methods of sub-metering are known. See, for example, U.S. Pat. Nos. 4,575,801; 4,783,748; 4,804,957; 6,947,854; and 7,252,543. Not all of these other systems and methods of sub-metering employ meter centers as defined herein. For example, the systems and methods described in U.S. Pat. No. 7,252,543 do not employ such meter centers and are limited in the number of units that can be sub-metered. Similarly, see Eaton Corporation's Cutler-Hammer PRC Tenant Meters, such as the PRC7000/PRC7500 Tenant Metering systems available from Eaton Corporation (Moon Township, Pa.). In addition, Square D by Schneider Electric (LaVergne, Tenn.) supplies metering products under the POWERLOGIC® trade name and meter centers employing socket-type meters under the Square D EZ Meter-Pak® trade name. Siemens Energy and Automation, Inc. (Alpharetta, Ga.) also supplies a variety of socket-type meter stacks for multi-family metering. In addition, Quadlogic (Long Island City, N.Y.) supplies a variety of metering products. For example, the "MiniCloset-5" (two coupled enclosures, each having dimensions of about 13.5 inches by 8.5 inches by 4.5 inches, with one enclosure housing a "Mini-Closet Interface Board" and the other housing a data collector) and "MiniCloset-5c" (one enclosure for all components, the enclosure having dimensions of about 18 inches by 10 inches by 6 inches) multi-tenant meters are sold by Quadlogic for the monitoring of up to twelve two-phase residential customers or up to eight three-phase commercial customers. The technical specifications for these meters state that 0.1 Amp and 5 Amp current input models are available. As such, these metering products are generally not able to distribute power directly from a utility line. Rather, these meters are constructed to be used in conjunction with and require a distinct power distribution panel as illustrated in technical literature on Quadlogic's internet website.

Despite the availability of certain metering products and meter centers, there is need for improvement in methods and apparatus for electrical power distribution and metering. Particularly desirable are improved methods and apparatus for sub-metering with the use of "gangable metering stacks." The present disclosure describes such improved methods and apparatus.

SUMMARY

The present teachings provide improved methods and apparatus for electrical power distribution and metering. According to the present teachings, an improved gangable meter center for distributing electric power to and measuring electric power consumption by a plurality of individually measured units in a complex comprises: a plurality of meters for measuring the electric power consumption by the plurality of individually measured units in the complex; and a plurality of feeder buses electrically coupled between at least one utility line supplying power to the plurality of individually measured units in the complex and the plurality of meters, wherein the plurality of meters are coupled to the meter center without use of a meter socket. In one embodiment, the plurality of individually measured units are within a multi-unit residential site. In another embodiment, the plurality of individually measured units are within a commercial site.

According to an exemplary embodiment, each meter comprises a digital electronic meter. In an exemplary embodiment, each meter is advantageously hard wired into the gangable meter center. Thus, advantages provided by digital electronic meters are capable of being incorporated into gangable meter centers. For example, an enclosed volume of the gangable meter center is about sixty-five percent (65%) less than an enclosed volume of a gangable meter center having an equal number of meters, but socket-type meters, and an equivalent power rating according to an exemplary embodiment of the invention.

According to another aspect of an exemplary embodiment, the plurality of feeder buses are electrically attached to the at least one utility line supplying power. According to yet another aspect of an exemplary embodiment, the plurality of feeder buses provide male connectors for ganging of the gangable meter center with female connectors on an adjacent gangable meter center.

According to a further embodiment, gangable meter centers further comprise a plurality of supply buses, each of which is electronically coupled to one of the plurality of feeder busses for supplying measured power to one of the plurality of individually measured units in the complex. According to an exemplary embodiment, gangable meter centers further comprise at least two bus jumper assemblies selectively coupled to the plurality of supply buses to provide power of the desired phasing to the plurality of individually measured units in the complex. For example, in one embodiment, a gangable meter center comprises two bus jumper assemblies selectively coupled to the plurality of supply buses to provide power of the desired phasing to the plurality of individually measured units in the complex.

According to yet a further embodiment, gangable meter centers comprise at least one disconnect switch coupled between each meter and the individually measured unit in the complex to which power is being distributed.

Also taught herein are ganged meter centers comprising at least two gangable meter centers. In an exemplary embodiment, male and female connectors are positioned at opposite sides of each gangable meter center enclosure within a ganged meter center of the invention. According to one aspect of ganged meter centers of the invention, adjacent meter centers are attached using male and female connectors. According to another aspect of ganged meter centers of the invention, adjacent meter centers are attached using at least one mechanical fastener.

DETAILED DESCRIPTION

Meter centers of the present teachings advantageously provide improved methods and apparatus for electrical power distribution and metering. Improved meter centers of the present disclosure advantageously distribute electric power to and measure electric power consumed by, for example, individual units within a multi-unit residential site (e.g., without limitation, an apartment building) or commercial site (e.g., without limitation, an office complex). Meter centers made in accordance with the present disclosure are expandable or "gangable." That is, meter centers of the invention are capable of being ganged (i.e., grouped, attached, or coupled) together such that they are electrically and mechanically coupled with one or more other meter centers. Any suitable coupling method and apparatus can be used to gang meter centers together according to the present teachings. For example, adjacent meter centers can be attached using male/female connectors, which may or may not be reinforced with mechanical bolts or other mechanical fasteners. Such gangable meter centers allow for addition and removal of meter centers and main service modules to accommodate differing electric power metering and distribution needs.

In accordance with the present teachings, an improved meter center measures the electric power consumed by a plurality of individually measured units within a complex. In one embodiment, the improved meter center comprises: a plurality of meters, wherein the plurality of meters measures electric power consumed by a plurality of individually measured units in a complex; a plurality of feeder buses electrically coupled to at least one utility line supplying power to the plurality of individually measured units in the complex; and wherein the meters used within the meter center do not utilize meter sockets.

Several advantages are realized by the elimination of meter sockets from gangable meter centers made in accordance with the present teachings. For example, by eliminating meter sockets from the presently disclosed gangable meter center, the overall number of device components required to implement a meter center is reduced. Further, because the prior art technique of clamping meters into meter sockets typically does not provide a secure electro-mechanical connection, malfunction or failure of meter centers due to faulty connection of meters or breakage of components within a meter socket is eliminated. Still further, fully enclosing electric meters within an enclosure (as taught by the presently disclosed gangable meter center) decreases the likelihood of tampering or theft of the electric meters as compared with the prior art approaches wherein watt-hour meters typically protrude from the meter centers.

Any suitable digital electronic meter, or combinations thereof, can be used to implement the plurality of meters used in the improved meter centers in accordance with the present teachings. Exemplary digital electronic meters are available, including those sold by Eaton Corporation—Marina Power & Light, Williamsburg, Va. under catalog numbers 58-7964-2 and 58-7965-2.2. In addition, suitable digital electronic meters are sold by Veris Industries, Portland, Oreg. under catalog number H8036. Such meters are coupled within gangable meter centers according to the present teachings.

In an exemplary embodiment, the plurality of feeder buses is electrically coupled (directly or indirectly) to at least one utility power line, wherein the utility power line supplies electric power. In some exemplary embodiments, each of a plurality of supply buses is associated with a corresponding one of the plurality of digital electronic meters for supplying measured power to the individually measured units in the complex. Those of ordinary skill in the electric power supply and measurement arts are familiar with a variety of apparatus and methodology for effectuating same.

Figure 3A:
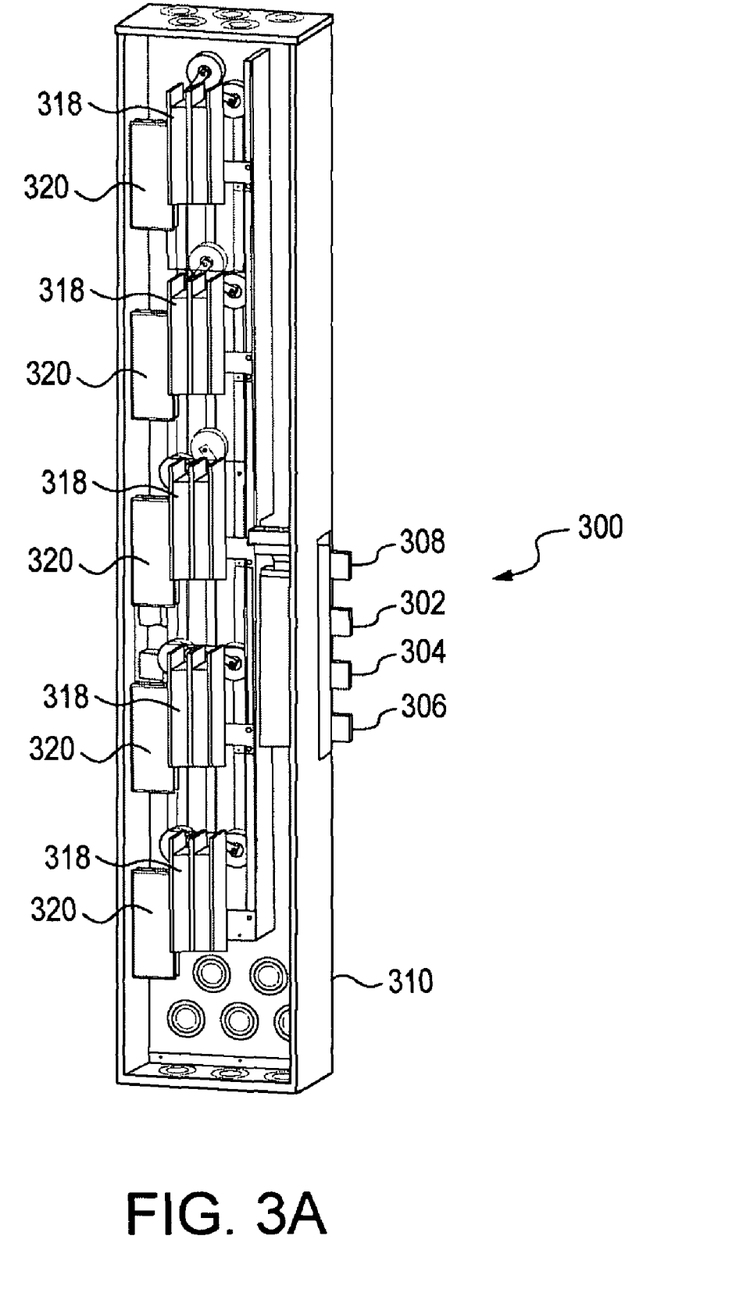
FIG. 3A is an isometric view of an expandable or "gangable" meter center made in accordance with the present disclosure comprising an enclosure housing five digital electronic meter assemblies.
Figure 3B:
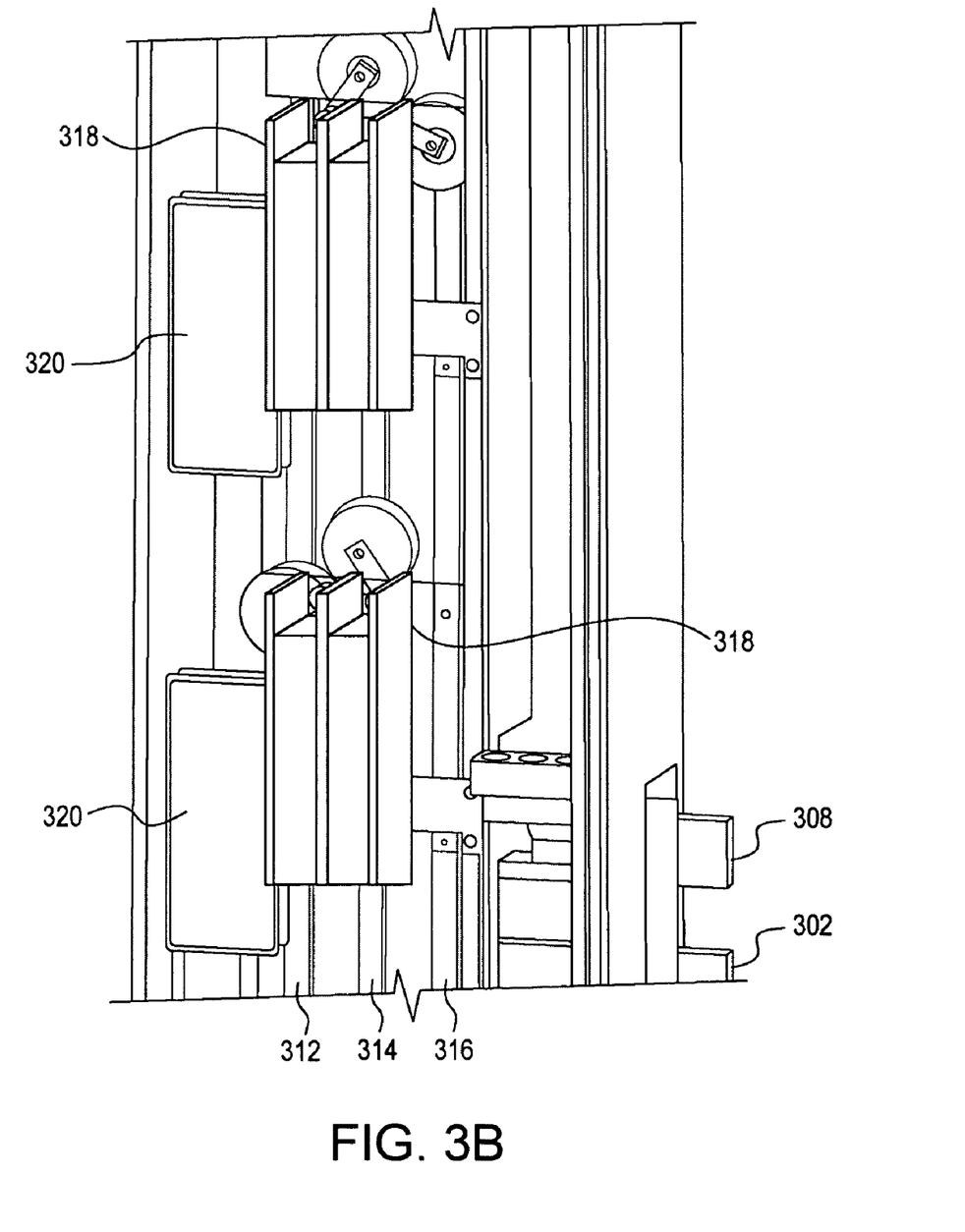
FIG. 3B is a partial isometric view of the meter center of FIG. 3A.
Figure 3C:
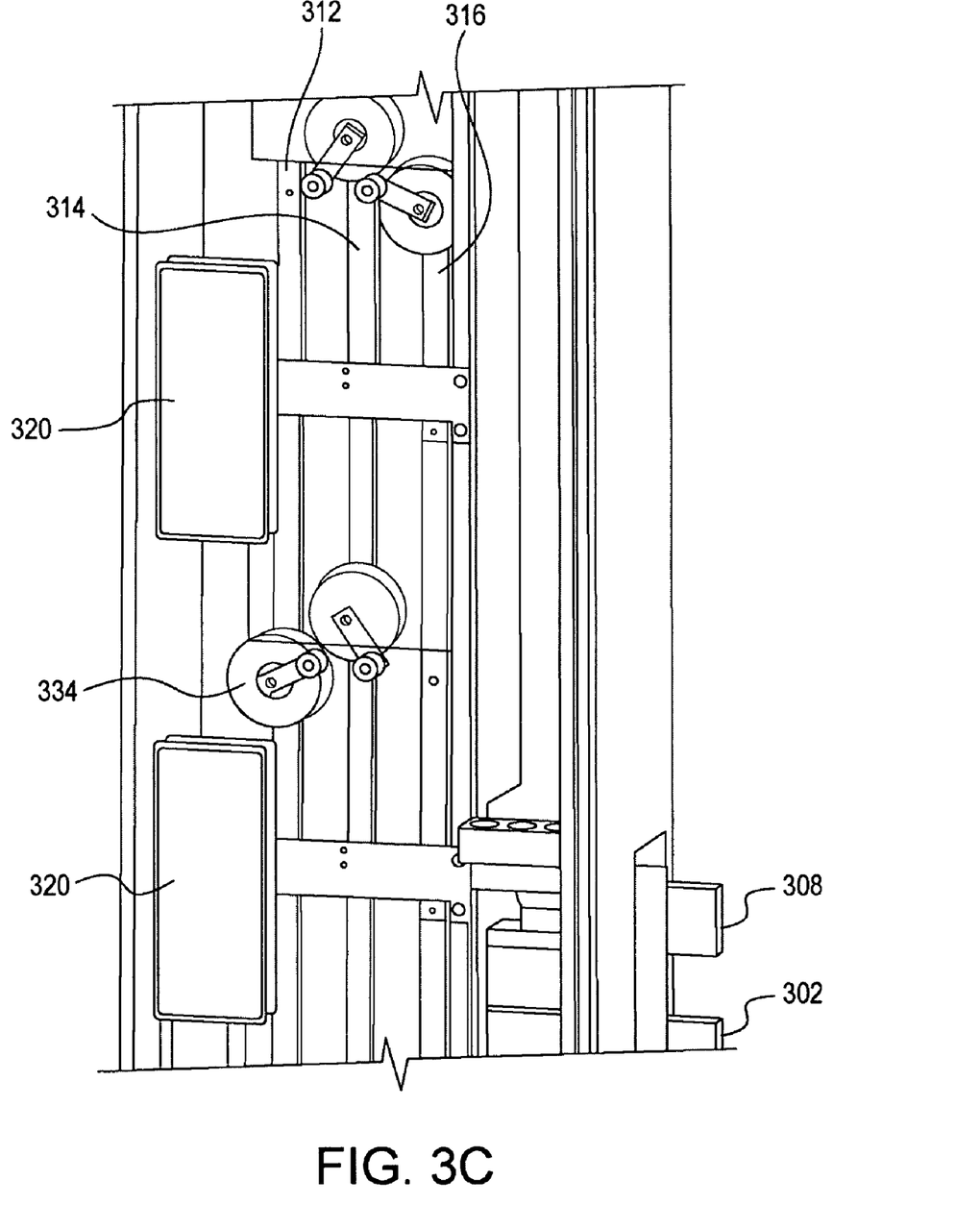
FIG. 3C is a partial isometric view of the meter center of FIG. 3A, wherein the meter center is shown with disconnect switches removed from their associated and corresponding bus jumper assemblies.

Referring now to FIGS. 3A-3D, in one embodiment of an expandable or gangable meter center 300, three phased feeder buses 302 (corresponding to phase A), 304 (corresponding to phase B), and 306 (corresponding to phase C), and a neutral feeder bus 308 extend horizontally through an enclosure 310 for electrical coupling to utility lines (not shown, but which typically correspond to a three-phased utility power system). As illustrated in FIG. 3B, three supply buses 312, 314, and 316 extend vertically within the gangable meter center 300 and are electrically coupled to respective associated and corresponding feeder buses 302, 304, 306. Any suitable method and apparatus can be used to couple the supply buses 312, 314, 316 to their respective associated and corresponding feeder buses 302, 304, 306. For example, a bolted connection (e.g., using screws) can be used to implement this electro-mechanical coupling. The feeder buses 302, 304, 306 are coupled to the supply buses 312, 314, 316 (corresponding to phases A, B, and C, respectively). The supply buses 312, 314, 316 are, in turn, coupled to associated and corresponding bus jumper assemblies 322 (shown in more detail in FIGS. 3C and 3D).

A disconnect switch 318 is typically coupled between each bus jumper assembly 322 and the individual unit to which power is distributed (or shut off upon operation of the disconnect switch 318) and measured. In some embodiments of the present gangable meter center, the disconnect switches 318 are implemented using circuit breakers. In some embodiments, each of the disconnect switches 318 have two or three poles. As shown in FIGS. 3A-3D, in some embodiments the plurality of disconnect switches 318 are mounted above the supply buses 312, 314, 316. The gangable meter center typically includes one to six disconnect switches 318. In the illustrated embodiment, each disconnect switch 318 has an associated and corresponding digital electronic meter assembly 320 comprising, for example, a wire harness, a number of current transformers per each disconnect switch pole, and an optional power consumption counter, all optionally enclosed within an electronic meter box. Those of ordinary skill in the electric power supply and measurement arts are familiar with individual components of digital electronic meter assemblies and their electrical connection within an electric power measurement system.

Figure 3D:
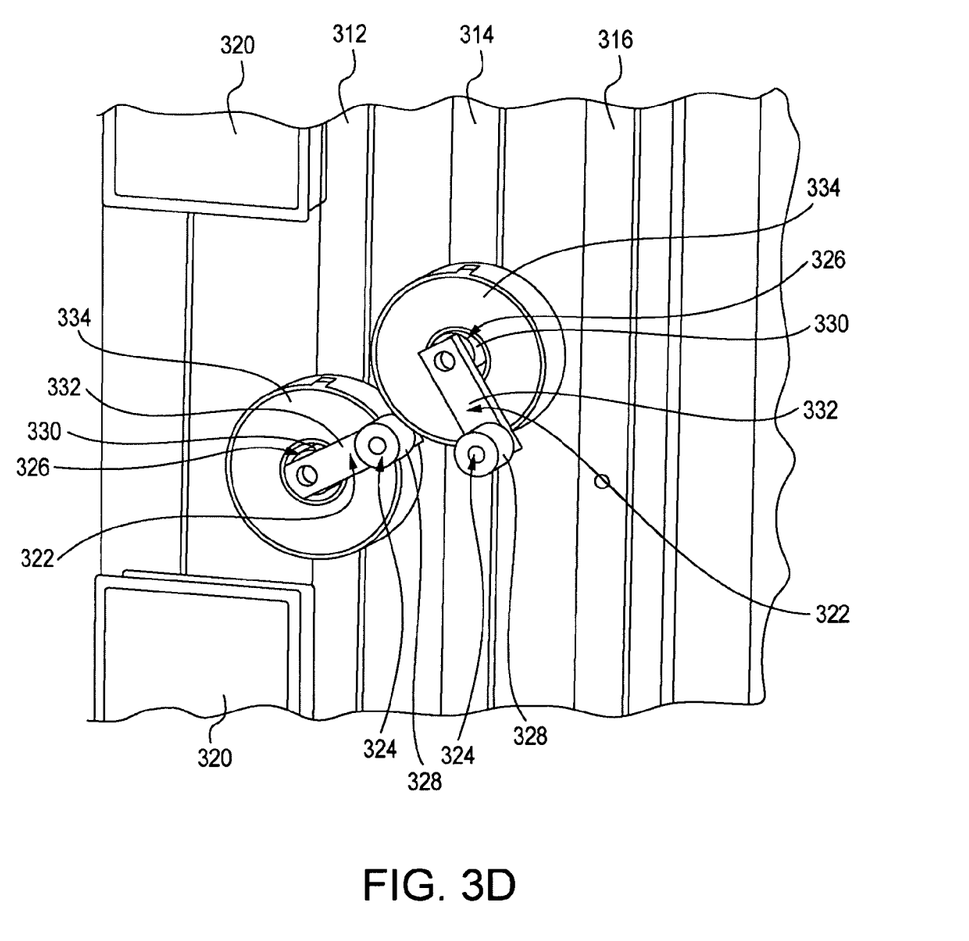
FIG. 3D is a magnified partial isometric view of the gangable meter center of FIG. 3A, as viewed in FIG. 3C, shown with one current transformer removed from its associated and corresponding bus jumper assembly.

As illustrated in FIG. 3D, the meter center 300 comprises a number of bus jumper assemblies 322 (also referred to herein as "phase balancers"), each typically comprising a first end 324 and a second end 326. The first end 324 of each bus jumper assembly 322 is electrically coupled to one of the poles of its associated and corresponding disconnect switch 318. The second end 326 of each bus jumper assembly 322 is electrically coupled to a supply bus bar (312, or 314, or 316). In one embodiment, each bus jumper assembly 322 comprises two cylindrical sleeves 328, 330 and a bus bar 332 having two ends, the first end being electrically coupled to the first cylindrical sleeve 328 making up the first end 324 of the bus jumper assembly 322 and the second end being electrically coupled to the second cylindrical sleeve 330 making up the second end 326 of the bus jumper assembly 322. In an alternative embodiment, the first cylindrical sleeve 328 may instead comprise a second bus bar (not shown) that is electrically coupled to the first end of the bus bar 332. In yet another alternative embodiment (not shown), each bus jumper assembly 322 comprises a "Z"-shaped bus bar having a first end and a second end. Each bus jumper assembly 322 is routed through an opening in a current transformer 334 from the digital electronic meter assembly 320 corresponding to the disconnect switch 318 to which said bus jumper assembly 322 is electrically coupled.

In order to distribute power through each meter center 300, power provided by a power utility line (not shown in the figures, and which typically corresponds to a three-phased power system) is coupled to the feeder busses 302, 304, 306. The feeder busses 302, 304 and 306 are fixedly coupled to an associated and corresponding supply bus 312, 314, and 316. More specifically, the feeder bus 302 (corresponding to phase A) is fixedly coupled to its associated and corresponding supply bus 312 (corresponding to phase A), the feeder bus 304 (corresponding to phase B) is fixedly coupled to its associated and corresponding supply bus 314 (corresponding to phase B), and the feeder bus 306 (corresponding to phase C) is fixedly coupled to its associated and corresponding supply bus 316 (corresponding to phase C). In order to provide power of a desired phasing (i.e., A-B, A-C, or B-C) to individual units using the gangable meter center of the present teachings, the bus jumper assemblies 322 are selectively coupled to the supply busses 312, 314, or 316. In the example shown in FIGS. 3A-3D, there are two bus jumper assemblies 322 for each of the three supply buses 312, 314, 316. As illustrated in FIG. 3D, a bus jumper assembly on the left (not shown because it is hidden by the current transformer 334) can be coupled to the supply bus 312 corresponding to phase A or the supply bus 314 corresponding to phase B. The bus jumper assembly 322 on the right can be coupled to the supply bus 314 corresponding to phase B or the supply bus 316 corresponding to phase C. As such, each bus jumper assembly 322 can be manually moved and coupled to one of the supply buses 312, 314, 316, such that each of the two bus jumper assemblies 322 is coupled to a differently phased supply bus 312, 314, 316.

Each individual unit to which power is distributed and measured has an optional associated and corresponding disconnect switch 318 through which it is supplied power. The disconnect switch 318 is the point in the power distribution network where power can be selectively turned on or off to individual units. Each disconnect switch 318 typically has two phases (i.e., a left phase and a right phase, such as A-B, A-C, or B-C). Because the bus jumper assemblies 322 are selectively coupled to the supply busses 312, 314, and 316, the disconnect switches 318 can be phased using three different phasings, namely, "A-B," "A-C," or "B-C". The left bus jumper assembly (not shown because it is hidden in FIG. 3D) is always coupled to the left disconnect phase. The right bus jumper assembly 322 is always coupled to the right disconnect phase. For example, if the left bus jumper assembly (not shown) is coupled to the supply bus 312 (corresponding to phase A) and the right bus jumper assembly 322 is coupled to the supply bus 316 (corresponding to phase C), the associated and corresponding disconnect switch 318 is phased "A-C". If the left bus jumper assembly (not shown) is coupled to the supply bus 312 (corresponding to phase A) and the right bus jumper assembly 322 is coupled to the supply bus 314 (corresponding to phase B), the associated and corresponding disconnect switch 318 is phased "A-B". Thus, the gangable meter center 300 using two-pole disconnect switches 318 can realize three individual phase combinations "A-B", "A-C", or "B-C" for each digital electronic meter assembly 320. In another embodiment, a gangable meter center using three-pole disconnect switches 318 is phased "A-B-C" for each digital electronic meter assembly and includes at least a third bus jumper assembly and corresponding current transformer.

Figure 4A:
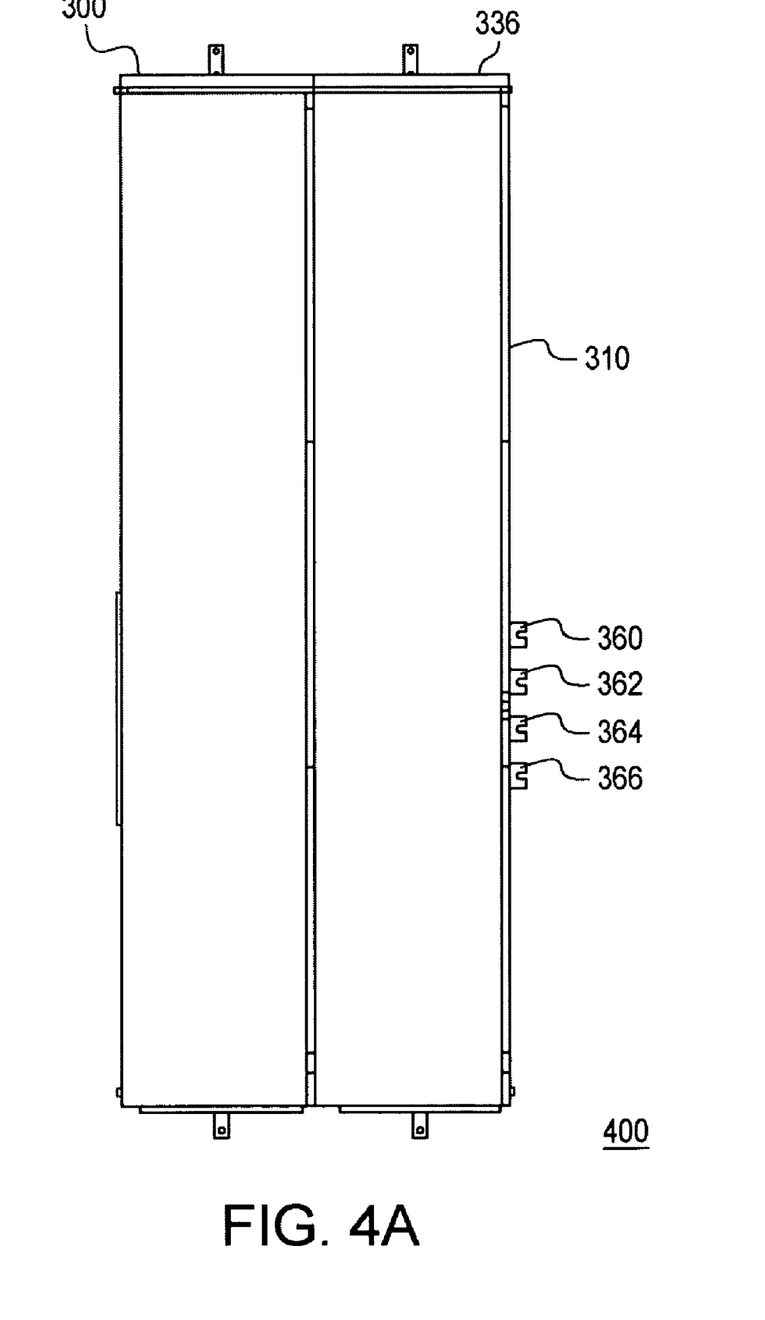
FIG. 4A is a front view of a "ganged" meter center made in accordance with the present disclosure comprising the gangable meter center of FIGS. 3A-3D ganged together with a second gangable meter center.

In a further embodiment, as shown in FIG. 4A, the gangable meter center 300 described above with reference to FIGS. 3A-3D is coupled (or "ganged") together with a second gangable meter center 336 made in accordance with the present teachings, resulting in a "ganged" meter center 400.

Those skilled in the electro-mechanical arts shall understand that two or more gangable meter centers may be coupled together to satisfy the performance requirements of a given power distribution and measurement system.

Figure 4B:
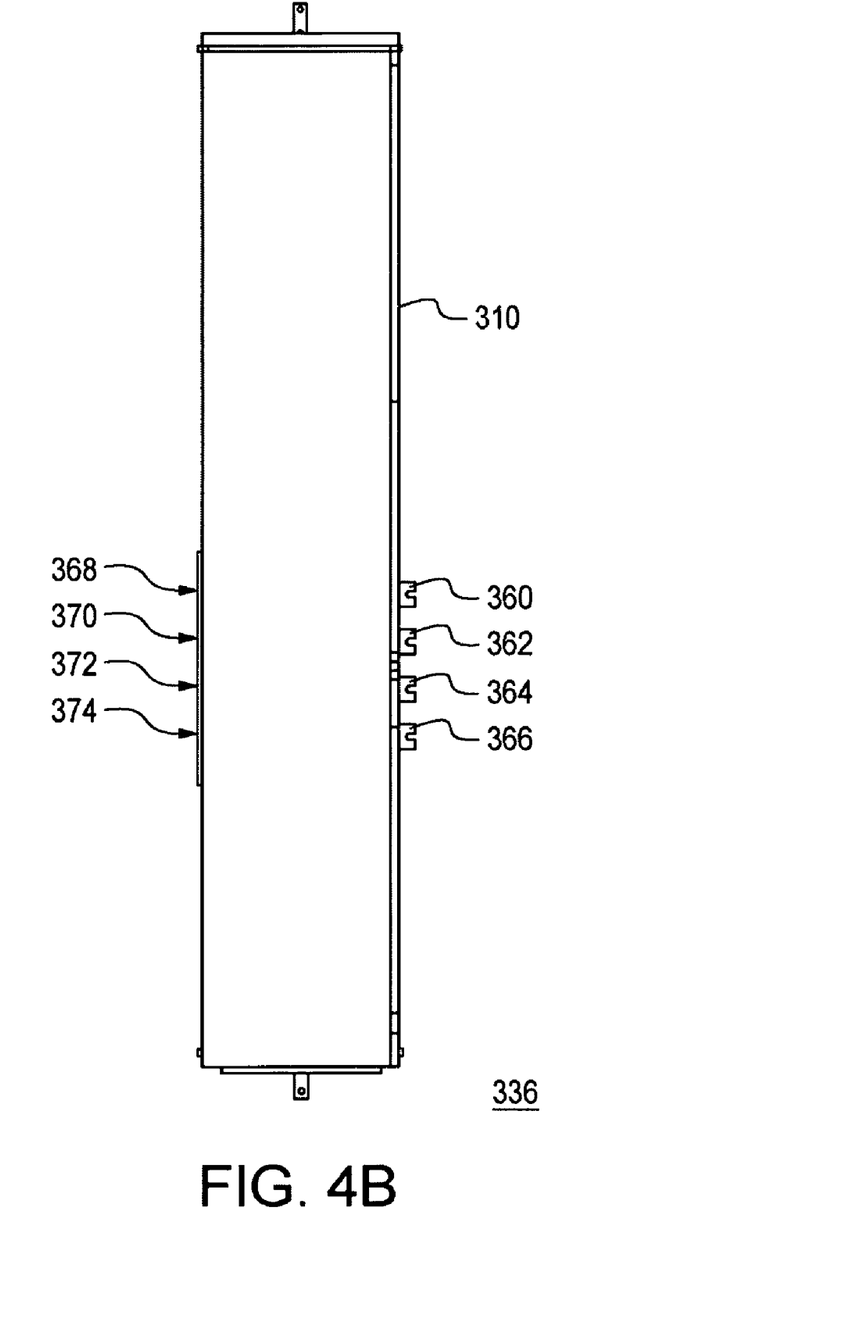
FIG. 4B is a front view of the second gangable meter center of FIG. 4A.
Figure 4C:
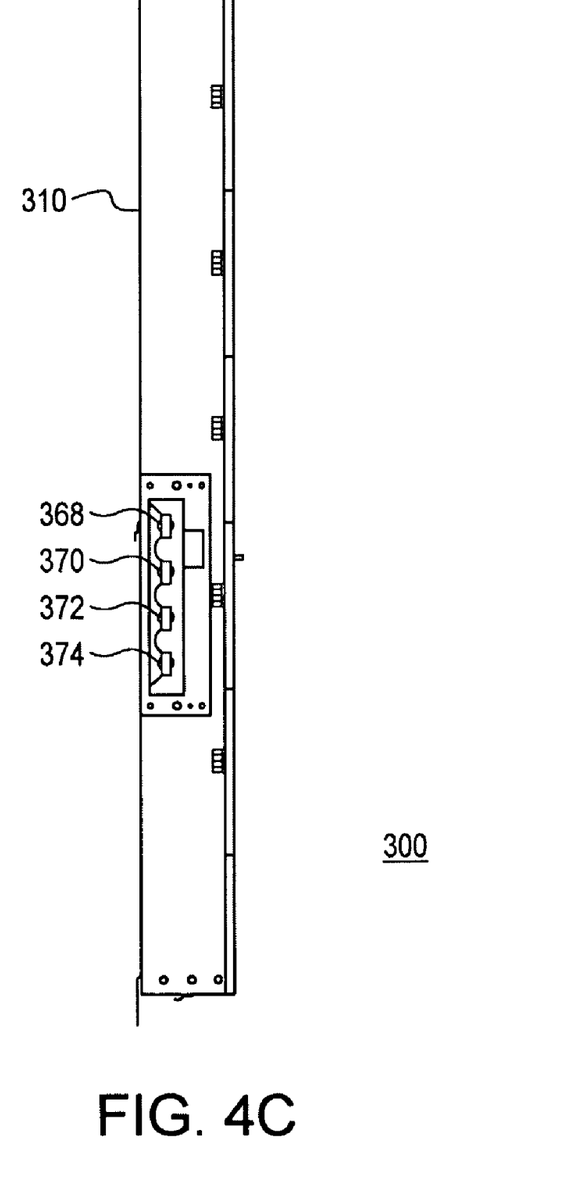
FIG. 4C is side view of the gangable meter center of FIGS. 3A-3D showing female connectors for use in implementing the ganged meter center of FIG. 4A.

As shown in FIG. 4B, in one embodiment, each feeder bus 302, 304, 306, and the neutral bus 308, has an associated and corresponding male and female connector, wherein, in one embodiment, the male and female connectors are positioned at opposite sides of the gangable meter center enclosure. For example, the neutral bus 308 has an associated and corresponding male connector 360, the feeder bus 302 has an associated and corresponding male connector 362, the feeder bus 304 has an associated and corresponding male connector 364, and the feeder bus 306 has an associated and corresponding male connector 366. The male connectors (i.e., the male connectors 360-366, inclusive) are positioned at a first end of the meter center (as shown in FIGS. 4A-4B, the male connectors 360-366 are positioned on the right side of the enclosure 310). Similarly, and as best shown in FIG. 4B and in the side view of the gangable meter center 300 shown in FIG. 4C, the neutral bus 308 has an associated and corresponding female connector 368, the feeder bus 302 has an associated and corresponding female connector 370, the feeder bus 304 has an associated and corresponding female connector 372, and the feeder bus 306 has an associated and corresponding female connector 374. The female connectors (i.e., the female connectors 368-374, inclusive) are positioned at a second end of the meter center (in FIGS. 4A-4B the female connectors 368-374 are positioned on the left side of the enclosure 310).

In the exemplary embodiments, the male connectors (i.e., the male connectors 360-366, inclusive) extend beyond the enclosure 310 of the meter centers 330, 336 and the female connectors (i.e., the female connectors 368-374, inclusive) are encased within the enclosure 310 of the meter centers 300, 336. When coupling or "ganging" two or more meter centers together, the male connectors of a first meter center are inserted within the associated and corresponding female connectors of a second meter center. The male connectors of a first meter center are inserted within the female connectors of a second meter center that have identical associated and corresponding supply busses. More specifically, and referring to FIGS. 4B and 4C, the ganged meter center 400 is implemented in one embodiment as follows: the male connector 360 of the meter center 300 is inserted within the female connector 368 of the meter center 336; the male connector 362 of the meter center 300 is inserted within the female connector 370 of the meter center 336; the male connector 364 of the meter center 300 is inserted within the female connector 372 of the meter center 336; and the male connector 366 of the meter center 300 is inserted within the female connector 374 of the meter center 336. Thus, in one exemplary embodiment, the feeder buses 302, 304, 306, 308 of the gangable meter centers are electro-mechanically coupled together to form the ganged meter center 400 of FIG. 4A.

The presently disclosed improved expandable meter center allows use of unconventional "non-socketed type" digital meters in implementing the meter center. By implementing the improved expandable meter center of the present disclosure using non-socketed type digital meters, the improved meter center is implemented with fewer components and has smaller overall dimensions as compared to prior art electrical power distribution and measurement equipment. By implementing expandable meter centers in accordance with the present teachings, certain prior art meter center components may be eliminated from the improved meter centers. For example, some conventional components that may be eliminated using the present teachings include the following: meter compartment barrier assemblies comprising, for example, a barrier, a bottom barrier endwall, and a top barrier endwall; tenant breaker bus bars; tenant breaker molded supports; tenant breaker support brackets; supply bus molded supports; meter socket assemblies comprising, for example, a meter socket base, springs, and jaw clips; meter socket mounting brackets; fifth jaw assemblies; neutral straps; neutral jumpers; horizontal bus shrouds; meter covers; meter cover latch brackets; and other miscellaneous insulators and hardware conventionally used in assembly of these components. As such, meter centers of the present teachings are capable of distributing electrical power to and metering power consumption by a plurality of individually measured units in a complex, all while occupying less space than conventional meter centers.

Improved expandable meter centers of the invention employing digital electronic meter assemblies are capable of occupying about sixty-five percent (65%) of the enclosed volume conventionally occupied by a meter center having an equal number of meters, but socket-type meters, and an equivalent power rating. In one embodiment, a five-meter, 200 A meter center of the present teachings advantageously occupies an enclosed volume of less than approximately 73,750 cm$^3$ (4,500 cubic inches). According to this embodiment, the meter center has dimensions of about 25 cm (10 inches) by 16.5 cm (6.5 inches) by 180 cm (70 inches). This is in comparison to a conventional five-meter, 200 A socket-type meter center occupying an enclosed volume of greater than 113,000 cm$^3$ (6,900 cubic inches) with dimensions of about 34 cm (13.5 inches) by 18 cm (7 inches) by 190 cm (75 inches). It is to be understood that dimensions, such as height, of each meter center can vary depending on, for example, the number of meters within the meter center. The number of meters within an enclosed meter center is dependent on regulations and laws, such as the National Electric Code in the United States, the ampere rating of any main device coupled to the meter center (or coupled to the first meter center in a series of meter centers arranged in a multiple metering stack), power rating of the meter center, and the maximum load (i.e., disconnect current) for each individual unit being measured by the meter center.

Improved expandable meter centers of the present teachings facilitate efficient sub-metering in a variety of complexes. Those of ordinary skill in the power distribution and metering arts are capable of using data that is generated by the improved meter centers for "sub-metering" or other desired purposes. Data collected by individual, or a plurality of individual, meters in the improved meter center can be communicated to a desired source using any suitable or convenient communication technology and methodology. For example, data may be transmitted wirelessly or using conventional communication lines. Any of a number of wireless communication technologies may be used. For example, Low Power Radio, GSM, GPRS, Bluetooth, and IrDA wireless communication technologies may be used in implementing the present improved meter center. Similarly, any number of wired communication protocols and technologies may also be used in implementing the present improved meter center. For example, telephone, cable (e.g., CAT-5), and serial interfacing (e.g., RS-232 and RS-485) wired links may be used in implementing the present improved meter center.

Various modifications and alterations of the disclosed methods and apparatus will become apparent to those skilled in the image processing arts without departing from the spirit and scope of the present teachings, which is defined by the accompanying claims. The appended claims are to be construed accordingly. It should also be noted that steps recited in any method claims below do not necessarily need to be performed in the order that they are recited. Those of ordinary skill in the image processing arts will recognize variations in performing the steps from the order in which they are recited.

The invention claimed is:

1. A gangable meter center distributing electric power to and measuring electric power consumption by a plurality of individual units, the gangable meter center comprising:
an enclosure;
a plurality of electronic meters housed within the enclosure; wherein the electronic meters measure electric power consumed by associated and corresponding individual units;
three phased feeder buses and one neutral feeder bus, wherein each of the feeder busses is electrically coupled to at least one utility power line supplying power to the plurality of individual units, and wherein each of the feeder busses extends horizontally throughout the enclosure;
three supply buses, wherein each of the supply busses is electrically coupled to a selected different one of the three phased feeder buses, and wherein the supply busses extend vertically throughout the enclosure;
two bus jumper assemblies, each of which comprises a bus bar comprising a first end and a second end, wherein the second end of each bus jumper assembly is electrically coupled to at least one of the three supply buses; and
a plurality of disconnect switches, wherein each disconnect switch has an associated and corresponding bus jumper assembly, electronic meter, and individual unit, wherein the disconnect switches include at least two poles, and wherein the first end of the bus bar of each associated and corresponding bus jumper assembly is coupled to one of the poles of its associated and corresponding disconnect switch,
wherein each bus jumper assembly is routed through an opening in a current transformer from the electronic meter corresponding to the disconnect switch to which said bus jumper assembly is electrically coupled.

2. The gangable meter center of claim 1, wherein each meter comprises a digital electronic meter.

3. The gangable meter center of claim 1, wherein the feeder buses provide male connectors for ganging of the gangable meter center with female connectors on an adjacent gangable meter center.

4. The gangable meter center of claim 1, wherein each of the supply buses has an associated and corresponding meter for supplying measured power to one of the plurality of individually units.

5. The gangable meter center of claim 1, wherein the plurality of individually units are within a multi-unit residential site.

6. The gangable meter center of claim 1, wherein the plurality of individually units are within a commercial site.

7. The gangable meter center of claim 1, wherein an enclosed volume of the gangable meter center is about sixty-five percent (65%) less than an enclosed volume of a gangable meter center having an equal number of meters, but socket-type meters, and an equivalent power rating.

8. A ganged meter center comprising at least two gangable meter centers of claim 1.

9. The ganged meter center of claim 8, wherein male and female connectors are positioned at opposite sides of each gangable meter center enclosure.

10. The ganged meter center of claim 8, comprising adjacent meter centers attached using male and female connectors.

11. The ganged meter center of claim 8, wherein adjacent meter centers are attached using at least one mechanical fastener.

12. The gangable meter center of claim 1, wherein the disconnect switches comprise circuit breakers.

13. The gangable meter center of claim 1, wherein the bus jumper assemblies comprise two cylindrical sleeves and the bus bar.

* * * * *